(12) United States Patent
Chen et al.

(10) Patent No.: US 6,532,423 B2
(45) Date of Patent: Mar. 11, 2003

(54) METHOD FOR DETERMINING FLUID FLOW CHARACTERISTIC CURVES OF HEAT-DISSIPATING SYSTEM

(75) Inventors: Yin-Yuan Chen, Taoyuan Shien (TW); Chia-Kuan Liao, Taoyuan Shien (TW); Chih-Jen Chen, Taoyuan Shien (TW)

(73) Assignee: Delta Electronics Inc., Taoyuan Shien (TW)

( * ) Notice: Subject to any disclaimer, the term of this patent is extended or adjusted under 35 U.S.C. 154(b) by 3 days.

(21) Appl. No.: 09/777,489

(22) Filed: Feb. 5, 2001

(65) Prior Publication Data

US 2002/0082782 A1 Jun. 27, 2002

(30) Foreign Application Priority Data

Nov. 6, 2000 (TW) ........................................ 89123419 A

(51) Int. Cl.$^7$ ................................................. G01F 1/00
(52) U.S. Cl. ............................. 702/45; 702/50; 702/66; 702/100; 702/136; 73/863.03
(58) Field of Search ............................... 702/45, 46, 47, 702/48, 49, 50, 57, 66, 99, 130, 136, 100; 73/53.04, 863.03

(56) References Cited

U.S. PATENT DOCUMENTS 4,781,525 A * 11/1988 Hubbard et al. .............. 415/17
5,996,422 A * 12/1999 Buck et al. .................... 702/25
6,363,255 B1 * 3/2002 Kuwahara .................... 704/224

OTHER PUBLICATIONS

Lay, David, Linear Algebra and its Applications, 1996, Addison–Wesley, 2$^{nd}$ Edition, pp. 414–418.*

* cited by examiner

Primary Examiner—Bryan Bui
Assistant Examiner—Hien Vo

(57) ABSTRACT

A method for determining a plurality of fluid flow characteristic curves of a heat-dissipating system, wherein each fluid flow characteristic curve is a relationship curve of one of an air pressure and an air flow and the air pressure and a rotating speed of the heat-dissipating system. The method includes steps of (a) determining a first fluid characteristic curve of the heat-dissipating system at a first condition, (b) obtaining a first variable and a second variable according to the first fluid characteristic curve, (c) calculating relative values of the air pressure, the air flow, the first variable and the second variable for obtaining a plurality of coefficients of a specific equation, (d) determining a third variable and a fourth variable of the heat-dissipating system at a second condition, and (e) replacing the first variable and the second variable of the specific equation with the third variable and the fourth variable respectively for obtaining a second fluid characteristic curve of the heat-dissipating system at the second condition.

9 Claims, 3 Drawing Sheets

US 6,532,423 B2

METHOD FOR DETERMINING FLUID FLOW CHARACTERISTIC CURVES OF HEAT-DISSIPATING SYSTEM

FIELD OF THE INVENTION

The present invention relates to a method for determining a plurality of fluid flow characteristic curves of a heat-dissipating system, and more particularly to one for using in an electronic product design requesting the heat-dissipating system.

BACKGROUND OF THE INVENTION

A heat-dissipating system is an essential part in many kinds of electric appliances. However, owing to the cost, most heat-dissipating systems use an air-cooled way by a fan for achieving heat dissipation. The main consideration to design the heat-dissipating system is to choose the fan type and to meet the requirements of size, rotating speed, and voltage for achieving the maximum efficiency.

Voltage is a most flexible and convenient parameter for adjusting the rotating speed, e.g. the fan speed control. Generally, a set of fluid flow characteristic curves of a heat-dissipating system can be obtained by adjusting voltage. Then, according to the set of fluid flow characteristic curves of the heat-dissipating system, the preferable assembly mode of the heat-dissipating system interactive with other internal devices of product can be decided for achieving the maximum efficiency of the heat-dissipating system.

FIG. 1 is a plot illustrating fluid flow characteristic curves of a heat-dissipating system at different voltages in a power supply according to the prior art. As shown in FIG. 1, the relation curves between the air pressure and the air flow, e.g. P–Q Curves, are determined at voltage ranged from 5 to 13V. Traditionally, it is necessary to measure the air pressure at each air flow under certain voltage. For example, the operating voltage range of heat-dissipating system is from 5 to 12 V, and more than 10 data points need to be measured at each operating voltage. If the time for measuring 10 data points is 40 minutes, then the total measured time is 320 minutes for 80 points (10 points/voltage×8 voltages=80 points). Therefore, although the traditional method is very simple, it is time-consuming. Also, repeating the measurement is labor intensive and monotonous. In addition, if the assembly mode or the electronic device are changed owing to the new design, the P–Q curves need to be re-established and the measurement has to be done again. Thus, the method according to the prior art is inefficient, inflexible, and costly.

Therefore the applicant tries to solve the problems encountered in the prior art.

SUMMARY OF THE INVENTION

It is therefore an object of the present invention to propose a method for determining a plurality of fluid flow characteristic curves of a heat-dissipating system in a short time.

It is therefore another object of the present invention to reduce cost through a simplified determination method.

According to one aspect of the present invention, there is provided a method for determining a plurality of fluid flow characteristic curves of a heat-dissipating system, wherein each fluid flow characteristic curve is a relationship curve of one of an air pressure and an air flow and the air pressure and a rotating speed of the heat-dissipating system. The method includes steps of (a) determining a first fluid characteristic curve of the heat-dissipating system at a first condition, (b) obtaining a first variable and a second variable according to the first fluid characteristic curve, (c) calculating relative values of the air pressure, the air flow, the first variable and the second variable for obtaining a plurality of coefficients of a specific equation, (d) determining a third variable and a fourth variable of the heat-dissipating system at a second condition, and (e) replacing the first variable and the second variable of the specific equation with the third variable and the fourth variable respectively for obtaining a second fluid characteristic curve of the heat-dissipating system at the second condition.

Certainly, the heat-dissipating system can be a fan.

Certainly, the first variable can be a maximum value of the air pressure and the second variable can be a maximum value of one of the air flow and the rotating speed at the first condition.

Certainly, the third variable can be a maximum value of the air pressure and the forth variable can be a maximum value of one of the air flow and the rotating speed at the second condition.

Preferably, the step (c) is performed by a data normalized analysis.

Certainly, the second condition can be at a voltage different from that of the first condition.

According to another aspect of the present invention, there is provided a recording medium for storing a program for executing a method for determining a plurality of fluid characteristic curves of a heat-dissipating system, wherein each fluid characteristic curve is a relationship curve of one of an air pressure and an air flow and the air pressure and a rotating speed of the heat-dissipating system. The method includes steps of (a) determining a first fluid characteristic curve of the heat-dissipating system at a first condition, (b) obtaining a first variable and a second variable according to the first fluid characteristic curve, (c) calculating relative values of the air pressure, the air flow, the first variable and the second variable for obtaining a plurality of coefficients of a specific equation, (d) determining a third variable and a fourth variable of the heat-dissipating system at a second condition, and (e) replacing the first variable and the second variable of the specific equation with the third variable and the fourth variable respectively for obtaining a second fluid characteristic curve of the heat-dissipating system at the second condition.

The present invention may best be understood through the following description with reference to the accompanying drawings, in which:

DETAILED DESCRIPTION OF THE PREFERRED EMBODIMENT

Figure 1:
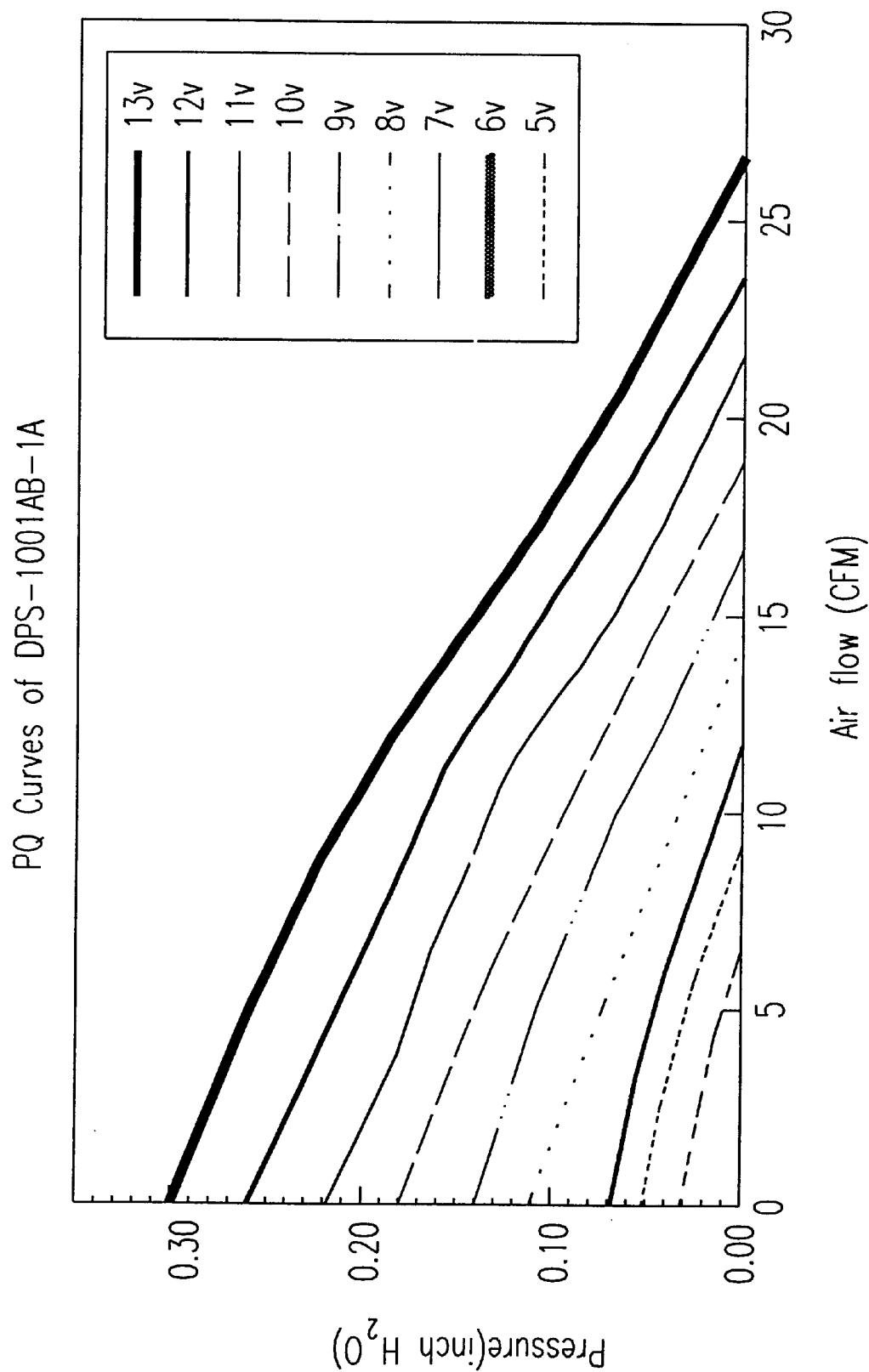
FIG. 1 is a plot illustrating fluid flow characteristic curves of heat-dissipating system at different voltages in a power supply according to the prior art.

The present invention proposes a method for determining a fluid flow characteristic curve of a heat-dissipating system to obtain a set of fluid flow characteristic curves. According to the set of curves, the assembly of the heat-dissipating system can be adjusted properly to achieve the most efficiency of the system.

The method according to the present invention includes following steps:

(a) measuring 10 data sets of air pressure (P) vs. air flow (Q) under a certain voltage, for example 12 V, wherein the air flow can be replaced with a rotating speed of the heat-dissipating system, (b) obtaining a P–Q curve according to two variables of P/Pmax and Q/Qmax, wherein P is the air pressure of the heat-dissipating system, Pmax is the maximum value of air pressure, Q is the air flow of the heat-dissipating system, and Qmax is the maximum value of air flow, (c) obtaining an regression curve equation of P–Q curve by normalization, shown as $y=f(x)=A_1x^n+A_2x^{n-1}+ \ldots +A_n$, wherein y is P/Pmax, and x is Q/Qmax;

(d) substituting Pmax and Qmax under different voltages to substitute into the regression curve equation for obtaining different P–Q curves under different voltages respectively.

The method according to the present invention is less time consuming than that of the prior art. According to the present invention, to determine 10 data points for 13 different voltages (for example: 5~12 V) is not necessary. Hence, 10 data points are determined under one certain voltage, for example, 12 V) for constructing a mathematical model, which only takes 40 minutes (e.g. 10 points×4 mm/point=40 minutes). Sequentially, only two data points determined under each voltage are required to obtain the P–Q curve by calculation. For example, there are 7 different voltages from 5 to 11 V. For each voltage, two data points have to be determined, so it takes 42 minutes (e.g. 2 points×3 mm/point×7 voltage=42 minutes). The total time consumption is 90 minutes according to the present invention when it is 320 minutes according to the prior art. Therefore, more than two-thirds measuring time can be saved.

Figure 2:
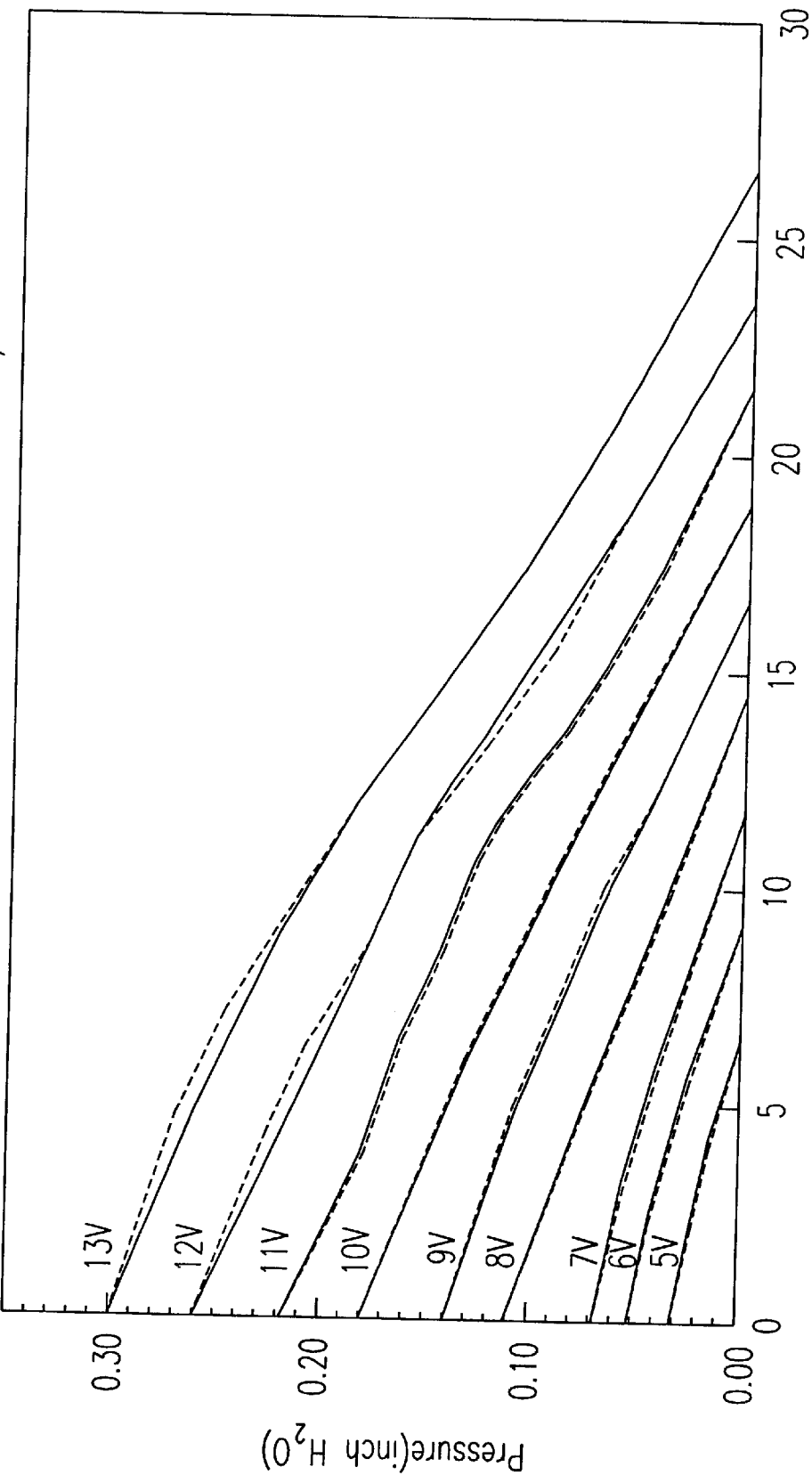
FIG. 2 is a plot illustrating fluid flow characteristic curves of heat-dissipating system at different voltages in the power supply according to a preferred embodiment of the present invention.
Figure 3:
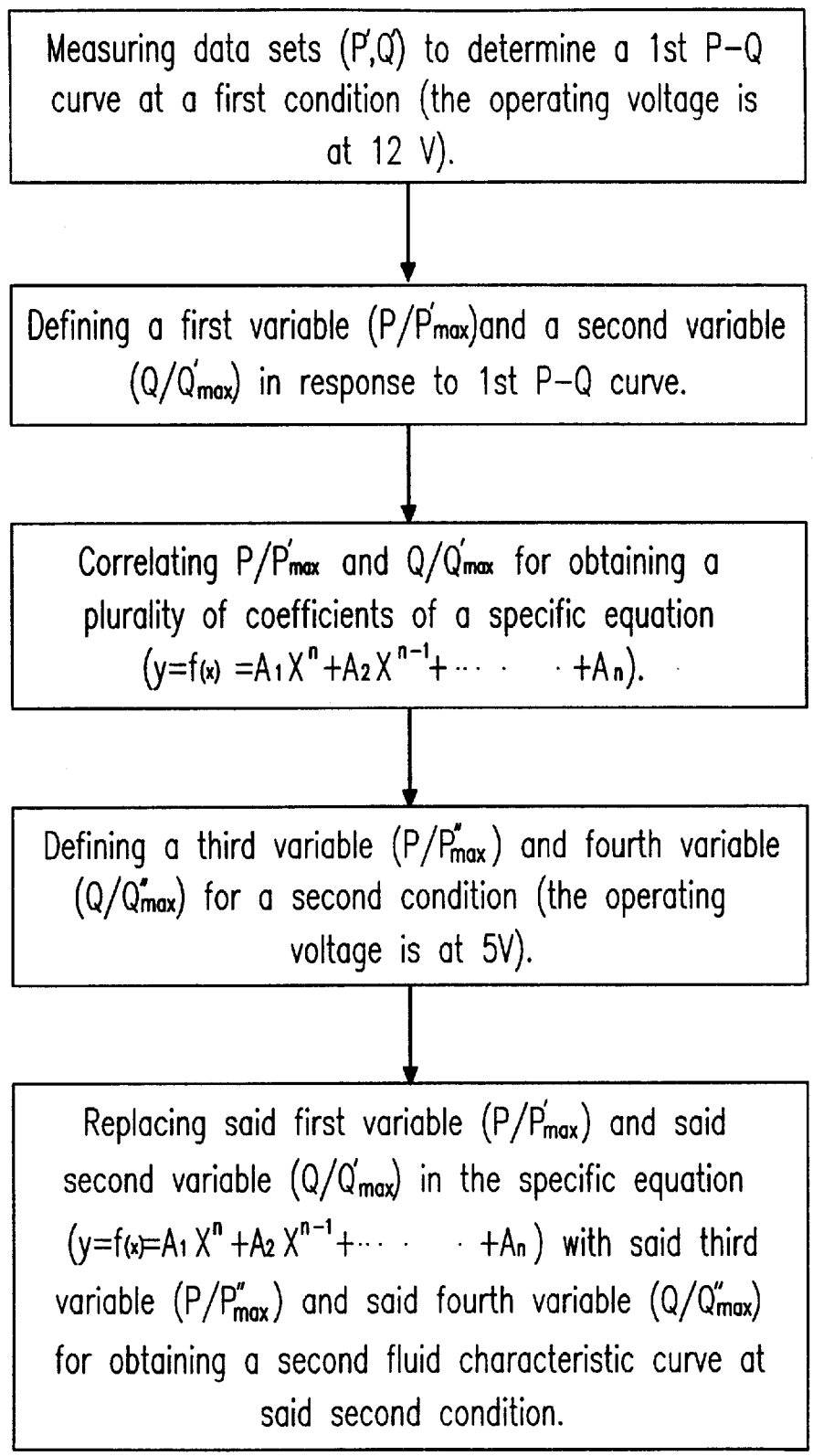
FIG. 3 is a flow diagram showing a method for determining fluid flow characteristic curves according to an embodiment of the present invention.

In addition, the deviation between the measured value and the calculated value is very small according to the present invention. FIG. 2 is a plot illustrating fluid flow characteristic curves of heat-dissipating system in the power supply. The solid lines represent the measured values, and the dash lines represent the calculated values. As the lines shown in FIG. 2, the calculated values according to the present invention are very close to the measured values, respectively. Table 1 shows that the comparison of measured and calculated pressure values at different air flow under 13 V in the power supply. From this table, the result indicates that the deviation of the calculated values are below 5%, which is an acceptable number in the industrial application.

TABLE 1

The comparison of measured and calculated pressure values at different air flow under 13 V in the power supply

| Data point | 1 | 2 | 3 | 4 | 5 | 6 | 7 | 8 | 9 |
|---|---|---|---|---|---|---|---|---|---|
| Q (cfm) | 26.04 | 23.45 | 20.95 | 18.49 | 17.25 | 14.76 | 12.49 | 10.38 | 0 |
| measured P(inwg) | 0 | 0.03 | 0.06 | 0.1 | 0.11 | 0.14 | 0.17 | 0.2 | 0.3 |
| calculated P(inwg) | 0 | 0.03 | 0.065 | 0.095 | 0.11 | 0.14 | 0.17 | 0.2 | 0.3 |

The present invention proposes the method which is based on the principles of the fan design principle, the least squares regression method, and the data normalized analysis. The calculated values obtained according to the present invention have high accuracy, so they are able to be used in determining the fluid flow characteristic curve of the heat-dissipating system. Therefore, for product research, development, design, and manufacture, the present invention can save a lot of money, especially for only changing electronic devices of the heat-dissipating product in the design stage. In addition, the present invention can be broadly applied to the equipments requesting the heat-dissipating system, such as overhead projector, computer, server and switchboard.

In sum, the present invention has the following advantages. First, the method for determining the fluid flow characteristic curve of the heat-dissipating system of the present invention can be flexibly applied to various product designs. Second, the present invention can decrease the cost of product design and manufacture for increasing the competitive capability of the product.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for determining a plurality of fluid flow characteristic curves of a heat-dissipating system, wherein each said fluid flow characteristic curve is a relationship curve of an air pressure and an air flow of said heat-dissipating system, comprising steps of:

(a) determining a first fluid characteristic curve of said heat-dissipating system at a first condition;

(b) defining a first variable and a second variable according to said first fluid characteristic curve;

(c) calculating relative values of said air pressure, said air flow, said first variable and said second variable for obtaining a plurality of coefficients of a specific equation;

(d) determining a third variable and a fourth variable of said heat-dissipating system at a second condition; and (e) replacing said first variable and said second variable of said specific equation with said third variable and said fourth variable respectively for obtaining a second fluid characteristic curve of said heat-dissipating system at said second condition.

2. The method according to claim 1, wherein said heat-dissipating system is a fan.

3. The method according to claim 1, wherein said first variable is an air pressure of said heat-dissipating system at said first condition divided by a maximum value of said air pressure at said first condition.

4. The method according to claim 1, wherein said second variable is an air flow of said heat-dissipating system at said first condition divided by a maximum value of said air flow at said first condition.

5. The method according to claim 1, wherein said third variable is an air pressure of said heat-dissipating system at said second condition divided by a maximum value of said air pressure at said second condition.

6. The method according to claim 1, wherein said fourth variable is an air flow of said heat-dissipating system at said second condition divided by a maximum value of said air flow at said second condition.

7. The method according to claim 1, wherein said step (c) is performed by a data normalized analysis.

8. The method according to claim 1, wherein said second condition is at a voltage different from that of said first condition.

9. A recording medium for storing a program for executing a method for determining a plurality of fluid characteristic curves of a heat-dissipating system, wherein each said fluid characteristic curve is a relationship curve of an air pressure and an air flow of said heat-dissipating system, comprising steps of:

(a) determining a first fluid characteristic curve of said heat-dissipating system at a first condition;

(b) defining a first variable and a second variable according to said first fluid characteristic curve;

(c) calculating relative values of said air pressure, said air flow, said first variable and said second variable for obtaining a plurality of coefficients of a specific equation;

(d) determining a third variable and a fourth variable of said heat-dissipating system at a second condition; and (e) replacing said first variable and said second variable of said specific equation with said third variable and said fourth variable respectively for obtaining a second fluid characteristic curve of said heat-dissipating system at said second condition.

* * * * *